United States Patent
Park et al.

(10) Patent No.: US 7,888,727 B2
(45) Date of Patent: Feb. 15, 2011

(54) SEMICONDUCTOR DEVICE AND GATE STRUCTURE HAVING A COMPOSITE DIELECTRIC LAYER AND METHODS OF MANUFACTURING THE SAME

(75) Inventors: Ki-Yeon Park, Yongin-si (KR); Kyoung-Ryul Yoon, Goyang-si (KR); Dae-Sik Choi, Seoul (KR); Han-Mei Choi, Seoul (KR); Seung-Hwan Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/457,364

(22) Filed: Jun. 9, 2009

(65) Prior Publication Data

US 2009/0250741 A1    Oct. 8, 2009

Related U.S. Application Data

(62) Division of application No. 11/366,453, filed on Mar. 3, 2006, now Pat. No. 7,560,349.

(30) Foreign Application Priority Data

Mar. 5, 2005   (KR) .......................... 2005-0018415

(51) Int. Cl.
*H01L 29/76* (2006.01)
*H01L 29/788* (2006.01)
*H01L 29/792* (2006.01)

(52) U.S. Cl. ...................... 257/314; 257/315; 257/321; 257/324

(58) Field of Classification Search ................. 257/314, 257/315, 321, 324, E29.309
See application file for complete search history.

(56) References Cited

U.S. PATENT DOCUMENTS

| | | | |
|---|---|---|---|
| 5,508,543 A * | 4/1996 | Hartstein et al. | ............ 257/314 |
| 6,020,238 A | 2/2000 | He et al. | |
| 6,127,227 A | 10/2000 | Lin et al. | |
| 6,346,489 B1 | 2/2002 | Cohen et al. | |
| 6,617,639 B1 | 9/2003 | Wang et al. | |
| 6,753,618 B2 | 6/2004 | Basceri et al. | |

(Continued)

FOREIGN PATENT DOCUMENTS

KR   1020010059661   7/2001

(Continued)

*Primary Examiner*—William M. Brewster
(74) *Attorney, Agent, or Firm*—Harness, Dickey & Pierce, P.L.C.

(57) ABSTRACT

A semiconductor device and/or gate structure having a composite dielectric layer and methods of manufacturing the same is provided. In the semiconductor device, gate structure, and methods provided, a first conductive layer may be formed on a substrate. A native oxide layer formed on the first conductive layer may be removed. A surface of the first conductive layer may be nitrided so that the surface may be altered into a nitride layer. A composite dielectric layer including the first and/or second dielectric layers may be formed on the nitride layer. A second conductive layer may be formed on the composite dielectric layer. The first dielectric layer may include a material having a higher dielectric constant. The second dielectric layer may be capable of suppressing crystallization of the first dielectric layer.

11 Claims, 9 Drawing Sheets

U.S. PATENT DOCUMENTS

| | | |
|---|---|---|
| 6,921,702 B2 | 7/2005 | Ahn et al. |
| 2004/0033698 A1 | 2/2004 | Lee et al. |
| 2004/0061169 A1* | 4/2004 | Leam et al. ............ 257/315 |
| 2004/0121534 A1* | 6/2004 | Lin et al. ............ 438/257 |
| 2004/0171280 A1 | 9/2004 | Conley et al. |
| 2004/0190294 A1 | 9/2004 | Gasquet et al. |
| 2005/0141168 A1 | 6/2005 | Lee et al. |
| 2006/0141695 A1 | 6/2006 | Choi et al. |
| 2007/0001201 A1 | 1/2007 | Kil et al. |
| 2007/0049051 A1 | 3/2007 | Ahn et al. |
| 2007/0111462 A1 | 5/2007 | Lee et al. |
| 2007/0228442 A1 | 10/2007 | Kakimoto |

FOREIGN PATENT DOCUMENTS

| | | |
|---|---|---|
| KR | 1020010066386 | 7/2001 |
| KR | 1020040002818 | 1/2004 |
| KR | 1020040057553 | 7/2004 |

* cited by examiner

SEMICONDUCTOR DEVICE AND GATE STRUCTURE HAVING A COMPOSITE DIELECTRIC LAYER AND METHODS OF MANUFACTURING THE SAME

PRIORITY STATEMENT

This application is a divisional application of U.S. Ser. No. 11/366,453, filed Mar. 3, 2006, now U.S. Pat. No. 7,560,349, the entire contents of which are incorporated herein by reference, which claims priority under 35 USC §119 from Korean Patent Application No. 2005-18415, filed on Mar. 5, 2005, in the Korean Intellectual Property Office, the entire contents of which are incorporated herein by reference.

BACKGROUND

1. Field of the Invention

Example embodiments of the present invention relate to a semiconductor device and/or gate structure having a composite dielectric layer and methods of manufacturing the same. Other example embodiments of the present invention relates to a semiconductor device and/or gate structure having a composite dielectric layer including a material having a higher dielectric constant and methods of manufacturing the same.

2. Description of the Related Art

Semiconductor devices may be classified as a volatile memory device and/or a non-volatile memory device. Examples of volatile memory devices may include dynamic random access memory (DRAM) devices and/or static random access memory (SRAM) devices. Examples of non-volatile memory devices may include read only memory (ROM) devices and electrically erasable programmable read only memory (EEPROM) devices. Examples of EEPROMs may include flash memory devices.

Flash memory devices may includes source/drain regions formed in a surface of a substrate (e.g. a silicon wafer), a channel region, a tunnel dielectric layer formed on the substrate, a floating gate electrode formed on the tunnel dielectric layer, a gate dielectric layer formed on the floating gate electrode and/or a control gate electrode formed on the gate dielectric layer.

An example of a gate dielectric layer may include a composite dielectric layer having an oxide-nitride-oxide (ONO) structure. In order to achieve a higher integration, a dielectric layer of a material, having a higher dielectric constant, may be used as the gate dielectric layer of the non-volatile memory device instead of the composite dielectric layer having the ONO structure. The dielectric layer of the material, having the higher dielectric constant, also may be used as a gate layer of a metal oxide semiconductor (MOS) transistor and/or a dielectric layer of a capacitor. The dielectric layer may be formed of aluminum oxide ($Al_2O_3$), hafnium oxide ($HfO_2$) and/or zirconium oxide ($ZrO_2$).

The conventional art acknowledges that a dielectric layer of zirconium oxide may be formed by using $Zr[N(CH_3)(C_2H_5)]_4$ (tetrakis ethyl methyl amino zirconium: TEMAZ) as a reaction material. In addition, conventional methods also recognize that a dielectric layer of zirconium oxide may be formed by using $ZrCl_4$ as a reaction material.

As known in the conventional art, a dielectric layer, which may include an aluminum oxide layer and/or an alloy layer, may be formed on the aluminum oxide layer. The alloy layer may include tantalum oxide, zirconium oxide, hafnium oxide, hafnium aluminum oxide and/or lanthanum aluminum oxide.

According to conventional methods, a dielectric layer may include a silicate interface layer and/or a layer that may have a dielectric constant of about 20. The layer may be formed on the silicate interface layer. In addition, the layer may be a hafnium oxide layer, a zirconium oxide layer, a tantalum oxide layer, an aluminum oxide layer, a titanium oxide layer, an yttrium oxide layer, a BST layer and/or a lead zirconium titanate (PZT) layer.

Furthermore, conventional methods of nitriding a surface of a conductive layer for the formation of a floating gate are known in the art.

SUMMARY OF THE EXAMPLE EMBODIMENTS

Example embodiments of the present invention provide a semiconductor device and/or gate structure including a composite dielectric layer and methods of manufacturing the same. Other example embodiments provide a semiconductor device and/or gate structure including a composite dielectric layer with a higher dielectric constant and methods of manufacturing the same.

In example embodiments of the present invention, there is provided a semiconductor device which may include a substrate; a tunnel dielectric layer formed on the substrate; a first conductive layer formed on the tunnel dielectric layer; an oxide layer formed on the first conductive layer; a nitride layer formed on the first conductive layer, after removing the oxide layer, a composite dielectric layer and/or a second conductive layer formed on the composite dielectric layer. The composite dielectric layer may include a first dielectric layer and/or a second dielectric layer. The first dielectric layer may include a material having a higher dielectric constant than the second dielectric layer.

In another example embodiment, the second dielectric layer may have a crystallization temperature higher than the first dielectric layer. In yet another embodiment, the second dielectric layer may retard crystallization of the first dielectric layer.

According to other example embodiments, the second conductive layer, the composite dielectric layer, the nitride layer, the first conductive layer and/or the tunnel dielectric layer may be patterned to form a gate structure including a control gate electrode, a composite dielectric layer pattern, a nitride layer pattern, a floating gate electrode and/or a tunnel dielectric layer pattern.

In accordance with example embodiments of the present invention, there are provided methods of manufacturing a semiconductor device and/or gate structure, the methods may include forming a first conductive layer on a substrate; removing an oxide layer formed on the first conductive layer; nitriding a surface of the first conductive layer to alter the surface into a nitride layer; forming a composite dielectric layer on the nitride layer and/or forming a second conductive layer on the composite dielectric layer.

According to the semiconductor device, gate structure and method provided, a first conductive layer may be formed on a substrate. A native oxide layer, which may be formed on the first conductive layer, may be removed. The native oxide layer may be removed using a diluted hydrogen fluoride solution and/or a diluted hydrogen fluoride vapor. Alternatively, the native oxide layer may be removed by a dry etching process using plasma.

A surface of the first conductive layer may be nitrided so that the surface of the first conductive layer may be altered into a nitride layer. The nitriding process may be a plasma nitriding process. Alternatively, the nitriding process may be a thermal nitriding process. The nitriding process may be performed under an ammonia atmosphere and/or a nitrogen atmosphere. A surface of a first conductive layer may be nitrided so that current leakage and/or impurity penetration through the first conductive layer may be suppressed.

A composite dielectric layer may be formed on the nitride layer. The composite dielectric layer may have a first dielectric layer and/or a second dielectric layer. The first dielectric layer may include a material having a high dielectric constant. The second dielectric layer may be capable of suppressing crystallization of the first dielectric layer. A second conductive layer may be formed on the composite dielectric layer.

To form the composite dielectric layer, the first dielectric layer may be formed on the nitride layer by an atomic layer deposition using a first oxidizer and/or a first reaction material that may include zirconium precursors. The zirconium precursor may be $Zr[N(CH_3)(C_2H_5)]_4$) and/or $Zr(O-tBu)_4$. These materials may be used alone or in a combination thereof.

The second dielectric layer may be capable of suppressing the crystallization of the first dielectric layer, which may be formed on the first dielectric layer by an atomic layer deposition. The second dielectric layer may have a crystallization temperature higher that that of the first dielectric layer.

The second dielectric layer may include hafnium oxide and/or aluminum oxide. The second dielectric layer may be formed using a second oxidizer and/or a second reaction material. The second oxidizer may be substantially the same as the first oxidizer. The second reaction material may include hafnium precursors and/or aluminum precursors.

The hafnium precursor may be $Hf[N(CH_3)_2]_4$, $Hf[N(C_2H_5)CH_3]_4$), $Hf[N(C_2H_5)_2]_4$, $Hf[OC(CH_3)_2CH_2OCH_3]_4$ and/or $Hf[OC(CH_3)_3]_4$. These materials may be used alone or in a combination thereof. The aluminum precursor may be $Al(CH_3)_3$ and/or $Al(C_2H_5)_3$. These materials may be used alone or in a combination thereof.

Processes for forming the first dielectric layer and/or processes for forming the second dielectric layer may be alternately performed at least once. The first dielectric layer may have a thickness of about 0.5 Å to about 10 Å. The second dielectric layer may have a thickness of about 0.5 Å to about 10 Å. The composite dielectric layer may have a thickness of about 100 Å to about 500 Å.

According to the example embodiments of the present invention, a composite layer may include a first dielectric layer of zirconium oxide and/or a second dielectric layer of hafnium oxide and/or aluminum oxide. The second dielectric layer may be formed on the first dielectric layer.

A crystallization temperature of hafnium oxide and/or aluminum oxide may be higher than zirconium oxide. Thus, a crystallization temperature of the composite layer may be supplemented by the higher crystallization temperature of the second dielectric layer, which may include hafnium oxide and/or aluminum oxide.

The electrical characteristics of a semiconductor (e.g., a non-volatile memory device and/or a capacitor), employing the composite dielectric layer, may be improved.

BRIEF DESCRIPTION OF THE DRAWINGS

Example embodiments of the present invention will become readily apparent by reference to the following detailed description when considered in conjunction with the accompanying drawings.

FIGS. 1 to 17 are cross-sectional views illustrating methods of manufacturing a semiconductor device and/or gate structure in accordance with example embodiments of the present invention.

DESCRIPTION OF EXAMPLE EMBODIMENTS

Figure 1:
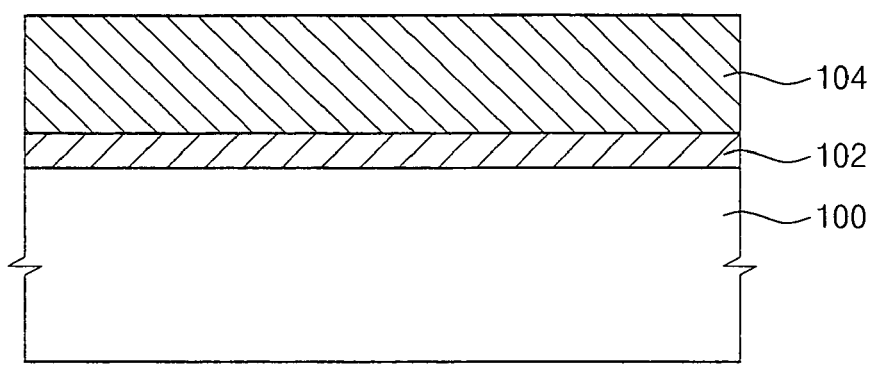
FIGS. 1-17 represent non-limiting example embodiments of the present invention as described herein.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the size and relative sizes of layers and regions may be exaggerated for clarity. The drawings are not to scale. Like reference numerals refer to like elements throughout.

It will be understood that when an element or layer is referred to as being "on" "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, there may be no intervening elements or layers present. As used herein, the term "and/or" may include any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms may be utilized to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be utilized to describe an element and/or feature's relationship to another element(s) and/or feature(s) as illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized and/or overly formal sense unless expressly so defined herein.

Embodiments of the present invention are described with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature of a device and are not intended to limit the scope of the present invention.

FIGS. 1 to 14 are cross-sectional views illustrating methods of manufacturing a semiconductor device and/or gate structure in accordance with example embodiments of the present invention.

Referring to FIG. 1, a substrate 100 (e.g., a silicon wafer) may be divided into an active region and/or a field region by an isolation process. A top view of the field region may be a line shape. The isolation process may be a shallow trench isolation (STI) process. The isolation process may be a local oxidation of silicon (LOCOS) process. The isolation process may be a self-aligned shallow trench isolation (SA-STI) process. In the SA-STI process, a floating gate and/or the active region may be formed simultaneously.

A thermal oxidation process may be performed on the substrate 100 to form a tunnel dielectric layer 102 on the substrate 100. The tunnel dielectric layer 102 may have a thickness of about 50 Å to about 100 Å. The tunnel dielectric layer 102 may include silicon oxide and/or silicon oxynitride.

A preliminary first conductive layer (not shown), which may include poly-silicon doped with impurities, may be formed on the tunnel dielectric layer 102. Particularly, a poly-silicon layer having a thickness of about 1,000 Å to about 1,500 Å may be formed on the substrate 100 by a low pressure chemical vapor deposition (LPCVD) process. Thereafter, the poly-silicon layer may be heavily doped with N-typed impurities by a doping process so that the preliminary first conductive layer may be formed. The doping process may be a phosphorus tetrachloride ($POCl_3$) diffusion process, an ion implantation process and/or an in-situ doping process.

Portions of the preliminary first conductive layer, the portions being positioned on the field region, may be removed by a photolithography process so that a first conductive layer 104 may be formed on the active region. After the photolithography process is finished, a nitriding process may be performed on the first conductive layer 104.

Figure 2:
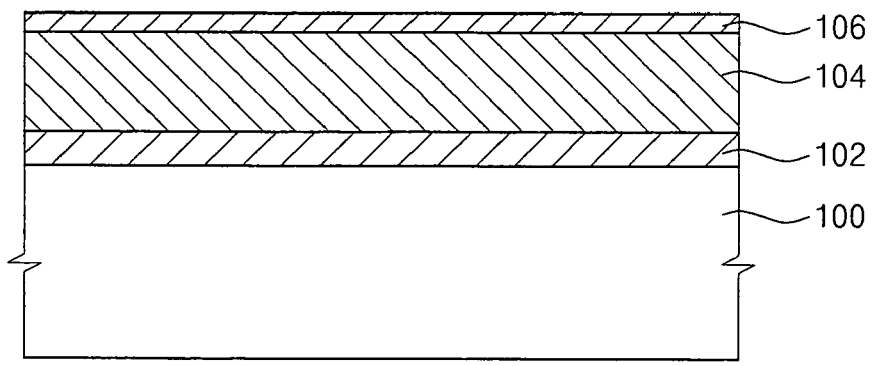

Referring to FIG. 2, a native oxide layer (not shown), which may be formed on the first conductive layer 104, may be removed. The native oxide layer may have a thickness ranging from approximately a few angstroms to approximately tens of angstroms. The native oxide layer may be formed after the photolithography process and/or prior to a nitriding process. The native oxide layer may retard diffusion of nitrogen, therefore the native oxide layer may be removed before the nitriding process.

The native oxide layer may be removed by a wet etching process using a diluted hydrogen fluoride (HF) solution and/or a dry etching process that may use a diluted hydrogen fluoride vapor. For example, the first conductive layer 104, on which the native oxide layer may be formed, may be dipped into the diluted hydrogen fluoride solution for about 1 minute so that the native oxide layer may be removed. The diluted hydrogen fluoride solution may include deionized (DI) water and/or a pure hydrogen fluoride solution. Particularly, a ratio of the DI water to the pure hydrogen fluoride solution may be about 200:1.

The native oxide layer may be removed by a dry etching process using plasma. Particularly, a reaction gas, which may include a fluorine compound, may be supplied onto the first conductive layer 104 through a remote plasma generator to remove the native oxide layer. The reaction gas may be a nitrogen trifluoride ($NF_3$) gas. The reaction gas may be introduced into an etching chamber through the remote plasma generator with the aid of a carrier gas. The carrier gas may be a nitrogen gas and/or an argon gas. These gases may be used alone or in a combination thereof. The dry etching process using the fluorine compound may be performed at a temperature of about 15° C. to about 30° C. In removing the native oxide layer, byproducts may be formed. In order to gasifying the byproducts, the byproducts may be thermally treated at a temperature of about 100° C. to about 200° C. After the byproducts are gasified, the byproducts may be efficiently exhausted from the etching chamber.

The native oxide layer may be removed by a plasma dry etching process using a sputter. Particularly, an argon gas and/or a hydrogen gas may be introduced into a plasma etching chamber. A radio frequency (RF) power may be applied to an upper electrode of the plasma etching chamber so that the argon gas and/or the hydrogen gas may have plasma states. An RF bias power may be applied to a lower electrode of the plasma etching chamber, the lower electrode supporting the substrate 100, in order that the native oxide layer may be removed. The argon gas may be used for generating the plasma states. The hydrogen gas may be used for removing the native oxide. A flow ratio of the argon gas to the hydrogen gas may be about 1:9 to about 2:3. A temperature of the plasma etching chamber may be about 580° C. to about 700° C. A pressure of the plasma etching chamber may be about 0.1 Torr to about 10 Torr.

After removal of the native oxide layer, the nitriding process may be performed on the first conductive layer 104 so that a surface of the first conductive layer 104 may be altered into a nitride layer 106. The nitriding process may be performed under an ammonia ($NH_3$) atmosphere and/or a nitrogen ($N_2$) atmosphere.

The nitriding process may be a plasma nitriding process and/or a thermal nitriding process. The plasma nitriding process may be performed at a temperature of about 300° C. to about 600° C. using an ammonia plasma gas and/or a nitrogen plasma gas. The thermal nitriding process may be performed at a temperature of about 500° C. to about 1,000° C. using an ammonia gas. The nitriding process may be performed for about 30 second to about 10 minute. The nitride layer 106, formed by the nitriding process, may have a thickness of about 5 Å to about 20 Å. A surface of the nitride layer 106 may be altered into a silicon nitride layer if the first conductive layer 104 includes poly-silicon doped with impurities.

Figure 10:
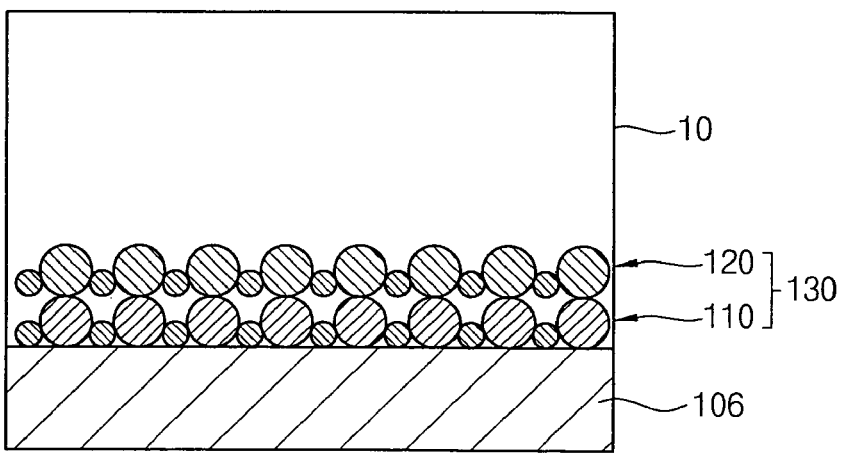

As shown in FIG. 10, a composite dielectric layer 130, which may include a first dielectric layer 110 (shown in FIG. 6) and/or a second dielectric layer 120, may be formed on the nitride layer 106. The first dielectric layer 110 and the second dielectric layer 120 may have a first crystallization temperature and a second crystallization temperature, respectively. The second crystallization temperature may be higher that the first crystallization temperature. In other example embodiments, the first dielectric layer 110 may include zirconium oxide. The second dielectric layer 120 may include hafnium oxide and/or aluminum oxide. The composite dielectric layer 130 may be formed by an atomic layer deposition (ALD) process to a thickness of about 100 Å to about 500 Å.

Hereinafter, processes for forming the composite dielectric layer 130 by using the ALD process will be described. The nitride layer 106 is illustrated in FIGS. 3 to 10 for convenience in explanation. The substrate 100, the tunnel dielectric layer 102, and the first conductive layer 104 are omitted in FIGS. 3 to 10 for convenience in explanation.

Figure 3:
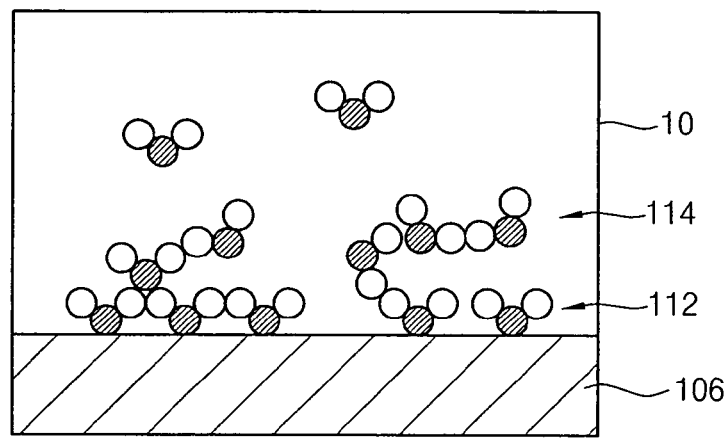

Referring to FIG. 3, the substrate 100 may be transferred into a chamber 10 used for performing the ALD process. If a temperature of the chamber 10 is below about 150° C., reaction materials for forming the composite dielectric layer 130 may not be efficiently reacted with each other. On the other hand, if the temperature of the chamber 10 is above about 400° C., the composite dielectric layer 130 is rapidly crystallized. Thus, the temperature of the chamber 10 may be maintained at a temperature of about 150° C. to about 400° C. As one example, the temperature of the chamber 10 may be about 250° C. to about 350° C. When the temperature of the chamber 10 is about 250° C. to about 350° C., crystallization and/or slow reaction rates may be efficiently avoided. As another example, the temperature of the chamber 10 may be about 300° C. When the temperature of the chamber 10 is about 300° C., a deposition characteristic of the ALD process may be efficiently achieved. If the pressure of the chamber 10 is below about 0.1 Torr, the reaction materials for forming the composite dielectric layer 130 may not be efficiently reacted with each other. On the other hand, if the pressure of the chamber is above about 3.0 Torr, process conditions of the ALD process may not be efficiently controlled. That is, in this pressure range, the ALD process may be easily controlled and/or a desired reaction rate may be achieved. Thus, The pressure of the chamber 10 may be about 0.1 Torr to about 3.0 Torr.

A first reaction material, which may include gaseous zirconium precursors, may be supplied onto the nitride layer 106. Particularly, the gaseous zirconium precursors may be supplied onto the nitride layer 106 using a nitrogen gas and/or an argon gas. The nitrogen gas and/or the argon gas may be used as a carrier gas. The gaseous zirconium precursors may be supplied onto the nitride layer 106 using a liquid delivery system (LDS) and/or a bubbler system. The zirconium precursor may be $Zr[N(CH_3)(C_2H_5)]_4$ (tetrakis ethyl methyl amino zirconium, also known as TEMAZ) and/or $Zr(O-tBu)_4$ (zirconium butyl oxide). These materials may be used alone or in a combination thereof. The first reaction material may be supplied onto the nitride layer 106 for about 0.5 seconds to about 3 seconds. For example, the first reaction material may be supplied onto the nitride layer 106 for about 2 seconds.

The first reaction material may be divided into a first portion 112 and/or a second portion 114. The first portion 112 of the first reaction material may be chemically attached to the nitride layer 106. The second portion 112 of the first reaction material may not be chemically bonded to the nitride layer 106. In another example embodiment, the second portion 114 of the first reaction material may be physically attached to the nitride layer 106 and/or the first portion 112. As another example, the second portion 114 of the first reaction material may float in the chamber 10.

Figure 4:
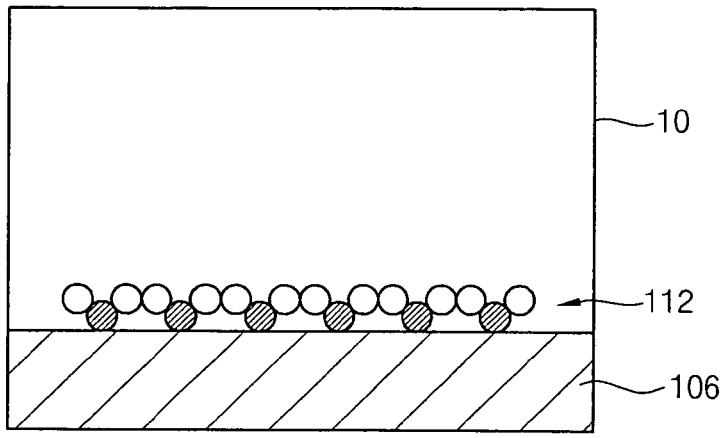

Referring to FIG. 4, a purge gas may be supplied into the chamber 10. The purge gas may be an argon gas and/or a nitrogen gas. These gases may be used alone or in a combination thereof. The purge gas may be supplied into the chamber 10 for about 0.5 seconds to about 5 seconds. For example, the purge gas may be supplied into the chamber 10 for about 2 seconds.

The second portion 114 of the first reaction material may be exhausted from the chamber 10 with the aid of the purge gas. For example, the second portion 114 of the first reaction material may be removed from the chamber 10 with the purge gas by using a vacuum pressure.

Figure 5:
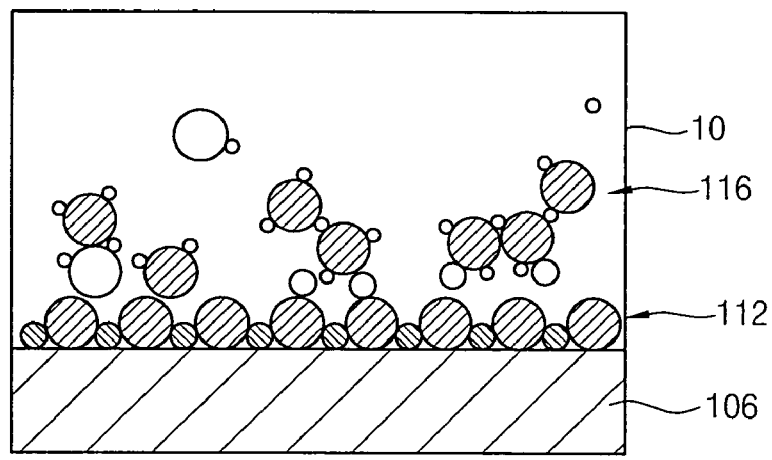

Referring to FIG. 5, a first oxidizer 116 may be supplied onto the first portion 112 of the first reaction material, the first portion 112 being chemically attached to the nitride layer 106. The first oxidizer 116 may react on the first portion 112 of the first reaction material so that a first dielectric layer 110, which may include zirconium oxide, may be formed on the nitride layer 106. The first oxidizer 116 may be an ozone ($O_3$) gas, an oxygen ($O_2$) gas, a water vapor ($H_2O$) gas and/or a plasma oxygen gas. These gases may be used alone or in a combination thereof.

In another example embodiment, the ozone gas may be used as the first oxidizer 116. The ozone gas may be supplied onto the first portion 112 of the first reaction material for about 1 second to about 5 seconds. For example, the ozone gas may be supplied onto the first portion 112 of the first reaction material for about 3 seconds.

Figure 6:
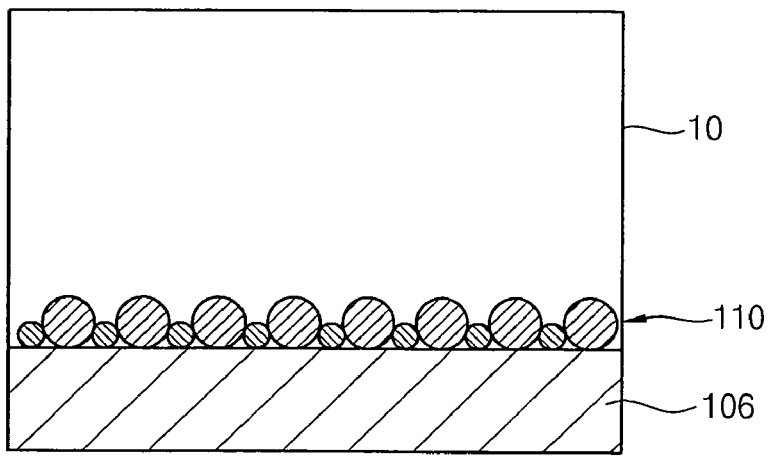

Referring to FIG. 6, a purge gas may be supplied onto the first dielectric layer 110 so that any unused oxidizer and/or byproducts, generated by reactions between the first portion 112 and/or the first oxidizer 116, may be removed the chamber 10. The purge gas may be supplied for about 1 second to about 5 seconds. For example, the purge gas may be supplied for about 3 seconds. In an alternative example embodiment, the purge gas may be supplied until the unused oxidizer and/or byproducts are substantially removed.

The first dielectric layer 110, which may include zirconium oxide, may have the first crystallization temperature that may be relatively low. For example, the first crystallization temperature is about 400° C. The first dielectric layer 110 may have a dielectric constant that may be relatively high. For example, the dielectric constant of the first dielectric layer 110 is about 35. Because the first crystallization temperature is relatively low, it is not desirable to use the first dielectric layer 110 alone even though the first dielectric layer has the relatively high dielectric constant.

Thus, according to example embodiments of the present invention, the second dielectric layer 120, having the second crystallization temperature higher than the first crystallization temperature of the first dielectric layer 110, may be formed on the first dielectric layer 110.

Figure 7:
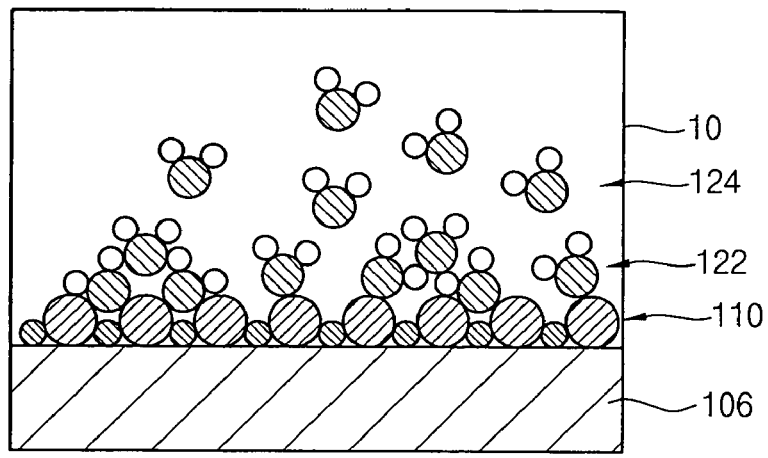

Referring to FIG. 7, a second reaction material, which may include hafnium precursors and/or aluminum precursors, may be supplied onto the first dielectric layer 110 formed on the nitride layer 106. In supplying the second reaction material, a temperature of the chamber 10 and/or a pressure of the chamber 10 may be constantly maintained. The second reaction material may be divided into a first portion 122 and a second portion 124. The first portion 122 of the second reaction material may be chemically attached to the first dielectric layer 110. The second portion 124 of the second reaction material may not be chemically attached to the first dielectric layer 110. In another example embodiment, the second portion 124 may be physically attached to the dielectric layer 110 and/or the first portion 122. In yet another example embodiment, the second portion 124 may float in the chamber 10.

The hafnium precursor may be $Hf[N(CH_3)_2]_4$ (tetrakis dimethyl amino hafnium, also known as TDMAH), Hf[N (C$_2$H$_5$)CH$_3$]$_4$ (tetrakis ethyl methyl amino hafnium, also known as TEMAH), Hf[N(C$_2$H$_5$)$_2$]$_4$ (tetrakis diethyl amino hafnium, also known as TDEAH), Hf[OC(CH$_3$)$_2$CH$_2$OCH$_3$]$_4$ and/or Hf[OC(CH$_3$)$_3$]$_4$. These materials may be used alone or in a combination thereof. The aluminum precursor may be Al(CH$_3$)$_3$ (trimethyl aluminum; TMA) and/or Al(C$_2$H$_5$)$_3$ (triethyl aluminum; TEA). These materials may be used alone or in a combination thereof.

The second reaction material may be supplied onto the first dielectric layer 110 for about 0.5 second to about 3 seconds. For example, the second reaction material may be supplied onto the first dielectric layer 110 for about 2 seconds.

Figure 8:
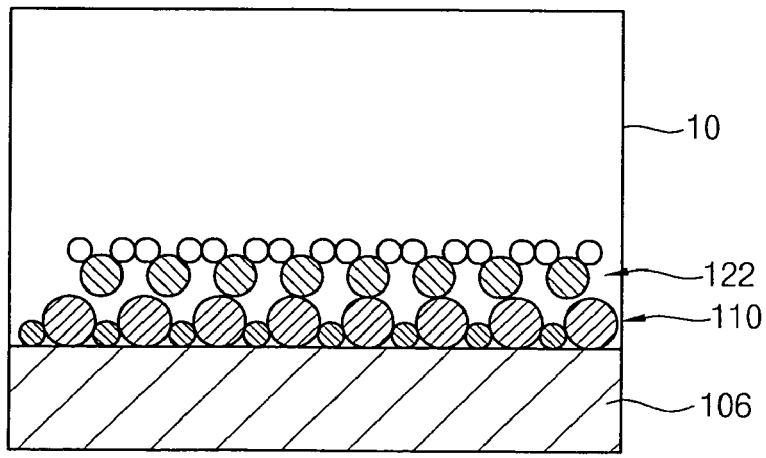

Referring to FIG. 8, a purge gas may be supplied into the chamber 10. The purge gas may be an inactive gas (e.g., a nitrogen gas). Alternatively, the purge gas may be an inert gas (e.g., an argon gas). The purge gas may be supplied into the chamber 10 for about 0.5 second to about 5 seconds. For example, the purge gas may be supplied into the chamber 10 for about 2 seconds.

The second portion 124 of the second reaction material may be exhausted from the chamber 10 with the aid of the purge gas. Particularly, the second portion 124 of the second reaction material may be removed from the chamber 10 with the purge gas by using a vacuum pressure.

Figure 9:
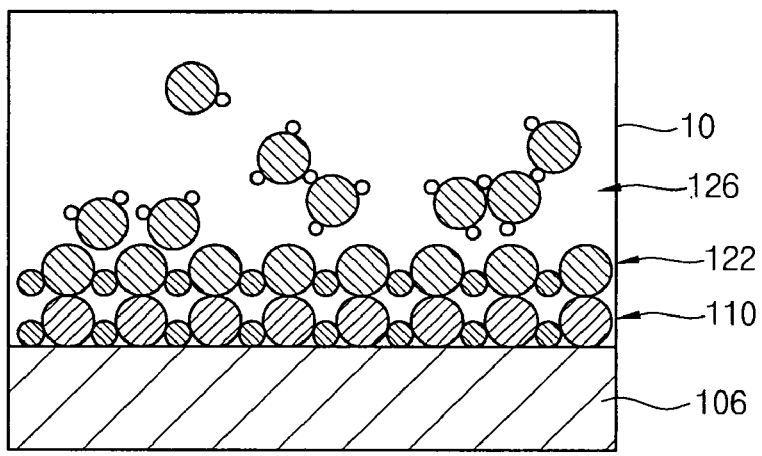

Referring to FIG. 9, a second oxidizer 126 may be supplied onto the first portion 122 of the second reaction material. The second oxidizer 126 may be substantially the same as the first oxidizer 116. Thus, any further explanations will be omitted. A second dielectric layer 120, which may include hafnium oxide and/or aluminum oxide, may be formed on the first dielectric layer 110 by reactions between the second oxidizer 126 and/or the first portion 122 of the second reaction material. The second oxidizer 126 may be an ozone gas, an oxygen gas, a water vapor gas and/or a plasma oxygen gas. These gases may be used alone or in a combination thereof.

According to yet another example embodiment, the ozone gas may be used as the second oxidizer 126. The ozone gas may be provided onto the first portion 122 of the second reaction material for about 1 second to about 5 second. For example, the ozone gas may be supplied onto the first portion 122 of the second reaction material for about 3 second.

Referring to FIG. 10, a purge gas may be supplied onto the second dielectric layer 120 so that an unused oxidizer and/or byproducts, generated by reactions between the second oxidizer 126 and/or the first portion 122 of the second reaction material, may be removed from the chamber 10. The purge gas may be supplied for about for about 1 second to about 5 seconds. For example, the purge gas may be supplied for about 3 seconds.

As a result, the composite dielectric layer 130, including the first dielectric layer 110 and/or the second dielectric layer 120, may be formed on the nitride layer 106. The first dielectric layer 110 may include zirconium oxide. The second dielectric layer 120 may include hafnium oxide and/or aluminum oxide.

Figure 11:
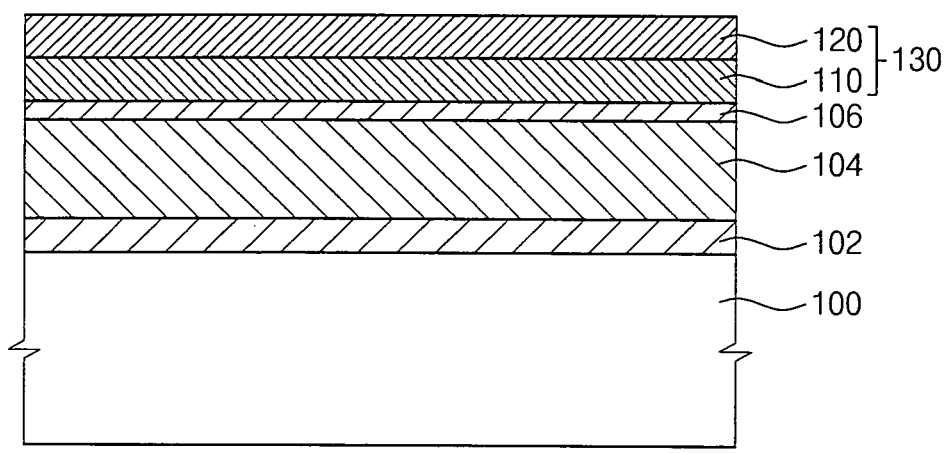

Referring to FIG. 11, processes for forming the first dielectric layer 110 and/or processes for forming the second dielectric layer 120 may be repeatedly performed until the composite dielectric layer 130 reaches a desired thickness. For example, the processes for forming the first dielectric layer 110 may be repeatedly performed until the first dielectric layer 110 has a total thickness of about 100 Å. In addition, the processes for forming the second dielectric layer 120 may be repeatedly performed until the second dielectric layer 120 has a total thickness of about 100 Å. Thus, the composite dielectric layer 130 may include more than two dielectric layers. In example embodiments, the second dielectric layer 120 may be formed on the first dielectric layer 110 after the formation of the first dielectric layer 110. Alternatively, the first dielectric layer 110 may be formed on the second dielectric layer 120 after the formation of the second dielectric layer 120.

Figure 12:
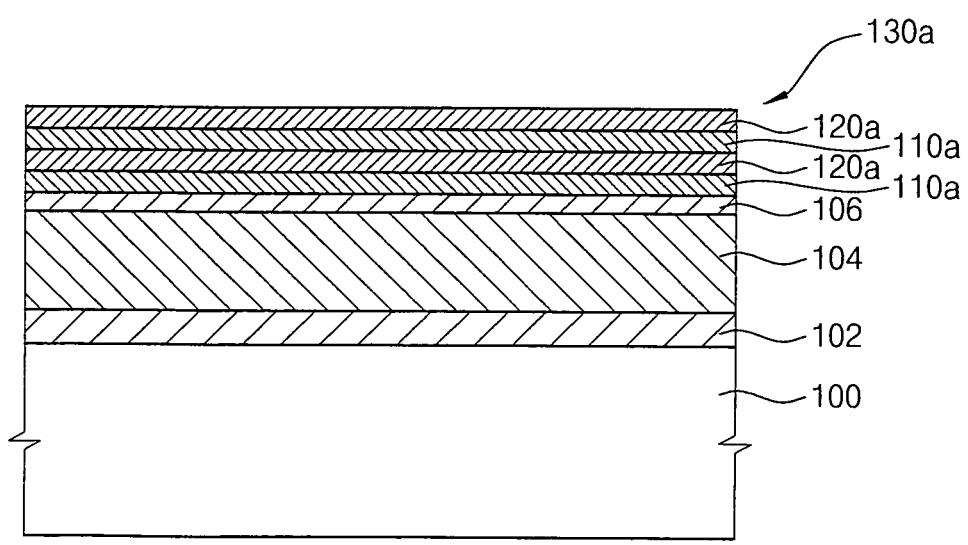

In another example embodiment, as illustrated in FIG. 12, first dielectric layers 110a and/or the second dielectric layers 120a may alternately be formed on the nitride layer 106 to form a composite dielectric layer 130a. In another example embodiment, the composite dielectric layer 130a may include three or more dielectric layers. In another example embodiment, there may be more than one composite dielectric layer 130a. Any or all of the composite dielectric layers 130a may have a laminated structure.

The first dielectric layer 110 may have a thickness of about 0.5 Å to about 10 Å. The second dielectric layer 120 may have a thickness of about 0.5 Å to about 10 Å. The composite dielectric layer 130a, which may include the first dielectric layers 110 and/or the second dielectric layers 120, may have a thickness of about 100 Å to about 500 Å.

The first dielectric layer 110a may be formed by processes substantially the same as illustrated in FIGS. 3 to 6. Thus, any further explanations will be omitted. The second dielectric layer 120a may be formed by processes substantially the same as illustrated in FIGS. 7 to 10. Thus, any further explanations will be omitted.

The second dielectric layer 120a may have a crystallization temperature higher than the crystallization temperature of the first dielectric layer 110a. For example, the second dielectric layer may include hafnium oxide and/or aluminum oxide. A crystallization temperature of hafnium oxide may be about 500° C. A crystallization temperature of aluminum oxide may be about 600° C. Thus, in case that the first dielectric layers 110a and/or the second dielectric layers 120a may alternately be formed on the nitride layer 106 to form the composite dielectric layer 130a, a crystallization temperature of the composite dielectric layer 130a may be higher than that of the first dielectric layer 110a. As a result, crystallization of the composite dielectric layer 130a may be suppressed. Suppressing may include reducing, retarding, hindering and/or inhibiting crystallization. For example, when forming the first dielectric layers 110a and/or the second dielectric layers 120a according to an atomic scale, the crystallization temperature of the composite dielectric layer 130a may adjust to about 900° C.

Figure 13:
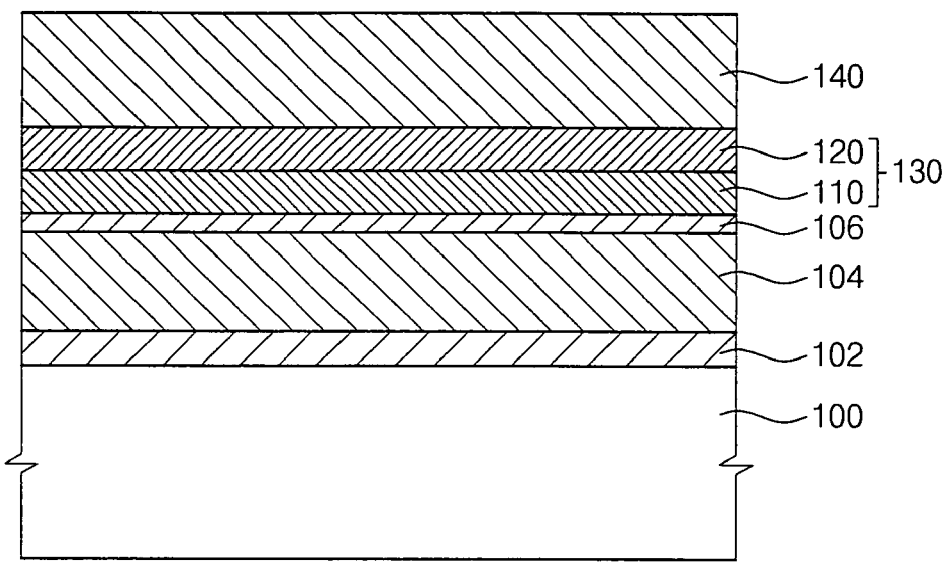

Referring to FIG. 13, a second conductive layer 140 may be formed on the composite dielectric layer 130. The second conductive layer 140 may include a doped poly-silicon layer which may or may not be doped with impurities. The doped poly-silicon layer may be formed by an LPCVD process and/or an impurity doping process. The doped poly-silicon layer may have a thickness of about 1,000 Å. In addition, a metal silicate layer (not shown) (e.g., a tungsten silicate (WSi) layer, a tantalum silicate (TaSi) layer and/or a titanium silicate (TiSi) layer) may be formed on the doped poly-silicon layer. The metal silicate layer may have a thickness of about 100 Å to about 1,500 Å.

Figure 14:
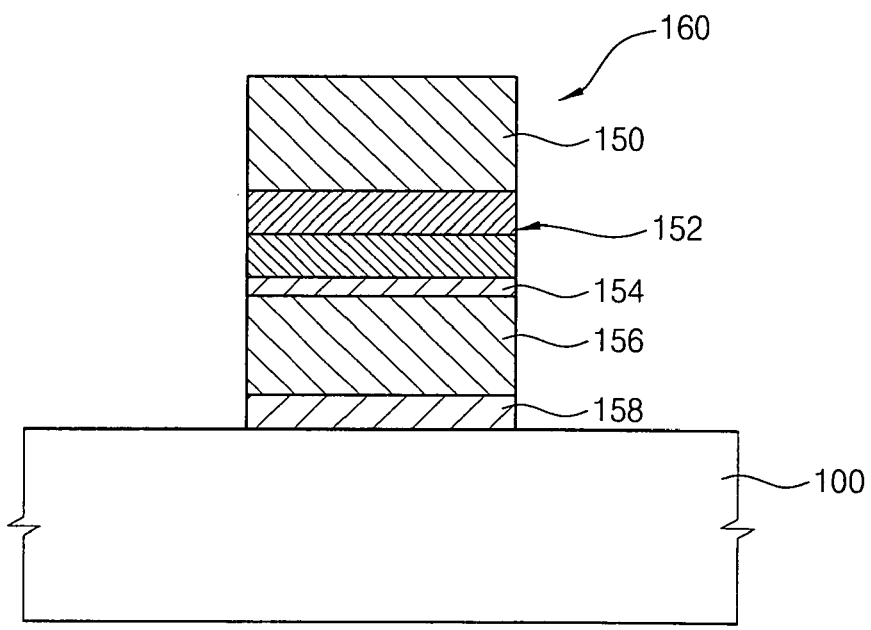

Referring to FIG. 14, the second conductive layer 140, the composite dielectric layer 130, the nitride layer 106, the first conductive layer 104 and/or the tunnel dielectric layer 102 may be patterned to form a control gate electrode 150, a composite dielectric layer pattern 152, a nitride layer pattern 154, a floating gate electrode 156 and/or a tunnel dielectric layer pattern 158. Thus, a gate structure 160, which may include the control gate electrode 150, the composite dielectric layer pattern 152, the nitride layer pattern 154, the floating gate electrode 156 and/or the tunnel dielectric layer pattern 158, may be formed on the substrate 100. The gate structure 160 may be formed by an anisotropic etching process using an etch mask (not shown). Source/drain regions (not shown) may be formed in portions of a surface of the substrate 100, the portions being adjacent to the gate structure 160, so that a non-volatile memory device may be manufactured.

Figure 15:
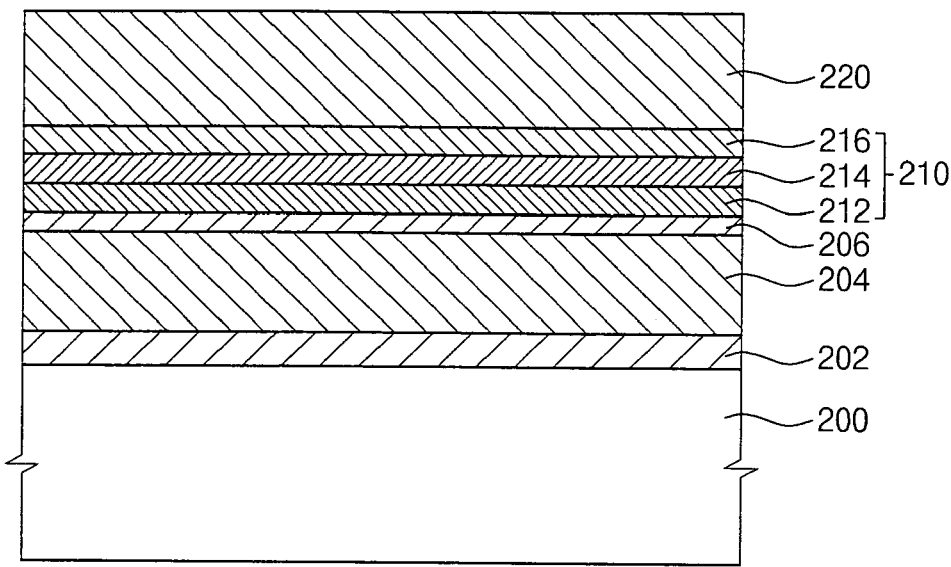
Figure 16:
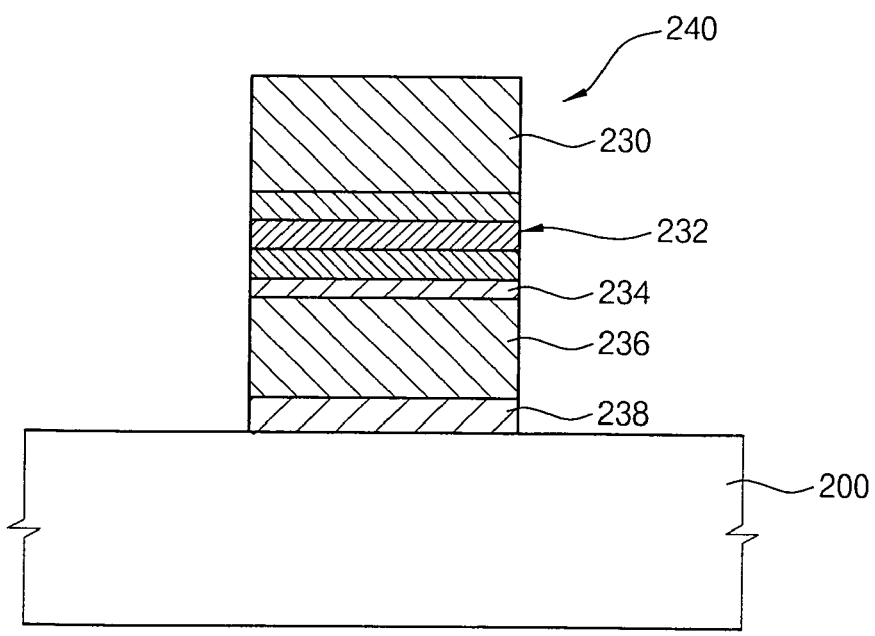

FIGS. 15 and 16 are cross-sectional views illustrating methods of manufacturing a semiconductor device in accordance with embodiments of the present invention.

Referring to FIG. 15, a tunnel dielectric layer 202 and/or a first conductive layer 204 may be subsequently formed on a substrate 200 (e.g., a silicon wafer). A native oxide layer, formed on the first conductive layer 204, may be then removed. A nitriding process may be performed on the first conductive layer 204 so that a surface of the first conductive layer 204 may be altered into a nitride layer 206. Processes for forming the tunnel dielectric layer 202, the first conductive layer 204 and/or the nitride layer 206 may be substantially the same as illustrated in FIGS. 1 and 2. Thus, any further explanations will be omitted.

A composite dielectric layer 210 having a laminated structure may be formed on the nitride layer 206. A first dielectric layer 212, which may include zirconium oxide, a second dielectric layer 214, which may include hafnium oxide, and/or a third dielectric layer 216, which may include aluminum oxide, may be sequentially formed on the nitride layer 206 by using an ALD process. In another example embodiment, the first dielectric layer 212, the second dielectric layer 214 and/or the third dielectric layer 216 may be sequentially formed over the nitride layer 206 at least once. The first dielectric layer 212 may have a thickness of about 0.5 Å to about 10 Å. The second dielectric layer 214 may have a thickness of about 0.5 Å to about 10 Å. The third dielectric layer 216 may have a thickness of about 0.5 Å to about 10 Å. The composite dielectric layer 210 may have a thickness of about 100 Å to about 500 Å. As described above, the third dielectric layer 216 may be stacked on the second dielectric layer 214. The second dielectric layer 214 may be stacked on the first dielectric layer 212. However, variations of a stacking order of the first to third dielectric layers 212 to 216 are to be appreciated. A second conductive layer 220 may be formed on the composite dielectric layer 210.

The first dielectric layer 212, the second dielectric layer 214 and/or the third dielectric layer 216 may be formed by processes substantially the same as illustrated in FIGS. 3 to 12. Thus, any further explanations will be omitted.

Referring to FIG. 16, the second conductive layer 220, the composite dielectric layer 210, the nitride layer 206, the first conductive layer 204 and/or the tunnel dielectric layer 202 may be subsequently patterned to form a control gate electrode 230, a composite dielectric layer pattern 232, a nitride layer pattern 234, a floating gate electrode 236 and/or a tunnel dielectric layer pattern 238. Thus, a gate structure 240, which may include the control gate electrode 230, the composite dielectric layer pattern 232, the nitride layer pattern 234, the floating gate electrode 236 and/or the tunnel dielectric layer pattern 238, may be formed on the substrate 200. A source/drain region (not shown) may be formed in portions of a surface of the substrate 200, the portions being adjacent to the gate structure 240, so that a non-volatile memory device may be manufactured.

Figure 17:
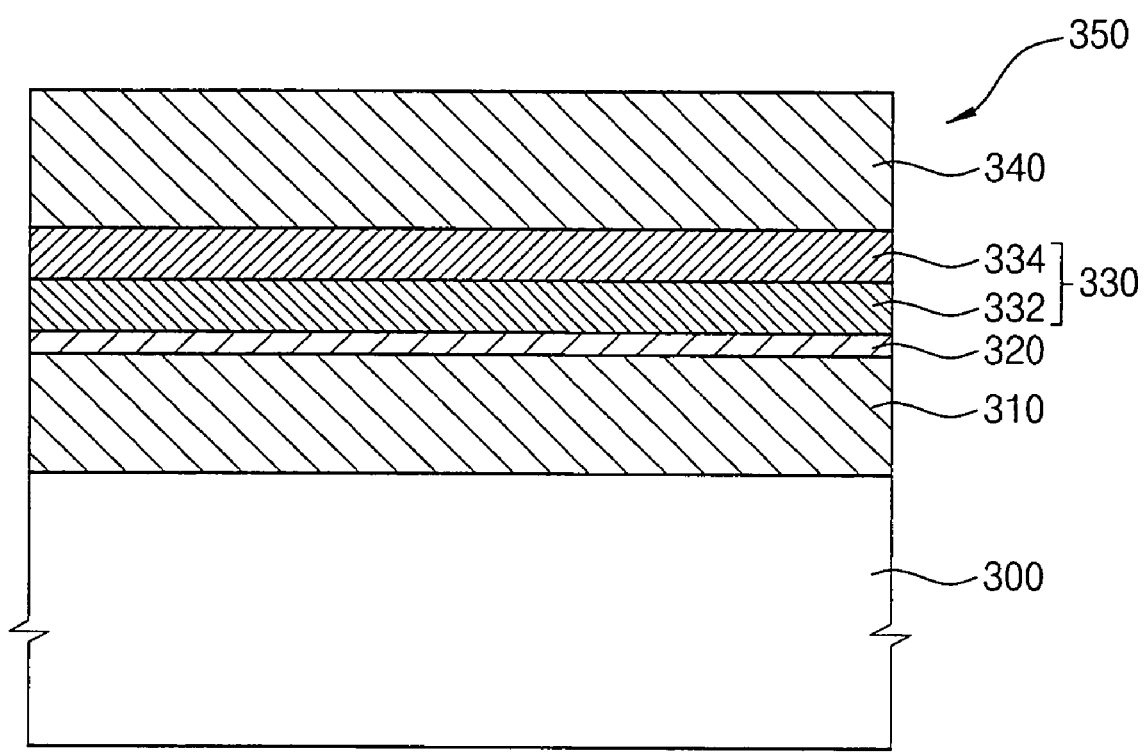

FIG. 17 is a cross-sectional view illustrating methods of manufacturing a semiconductor device in accordance with example embodiments of the present invention.

Referring to FIG. 17, a substrate 300 (e.g., a silicon wafer) may be prepared. The substrate 300 may include a semiconductor structure (not shown) (e.g., a gate structure, a source/drain and/or a bit line).

A first conductive layer 310 may be formed on the substrate 300, which may include the semiconductor structure. The first conductive layer 310 may correspond to a lower electrode. The first conductive layer 310 may or may not be formed using a poly-silicon doped with impurities. The first conductive layer 310 may be formed by an LPCVD process. In another example embodiment, the first conductive layer 310 may include a metal and/or a metal nitride. The metal may be titanium, ruthenium, tantalum and/or tungsten. The metal nitride may be titanium nitride, ruthenium nitride, tantalum nitride and/or tungsten nitride. As illustrated in FIG. 17, the first conductive layer 310 may have a plate shape. Alternatively, the first conductive layer 310 may have a cylindrical shape. If the first conductive layer 310 has a cylindrical shape, an effective area of the first conductive layer 310 may be increased. The first conductive layer 310 may be electrically coupled to an impurity region formed in a surface of the substrate 300. For example, the first conductive layer 310 may be electrically connected to a source/drain region of a cell transistor of a dynamic random assess memory (DRAM) formed the substrate 300.

A native oxide layer formed on the first conductive layer 310 may be removed. A nitriding process may be performed on the first conductive layer 310 so that a surface of the conductive layer 310 may be altered into a nitride layer 320. Thereafter, a composite dielectric layer 330 may be formed on the nitride layer 320 by using an ALD process. Particularly, a first dielectric layer 332, which may include zirconium oxide, may be formed on the nitride layer 320. A second dielectric layer 334, which may include hafnium oxide and/or aluminum oxide, may be formed on the first dielectric layer 332. A third dielectric layer (not shown), which may include aluminum oxide, may be formed on the second dielectric layer 334, which may include hafnium oxide.

The composite dielectric layer 330 may be formed by processes substantially the same as illustrated in FIGS. 3 to 12 and FIG. 15. Thus, any further explanations will be omitted.

A second conductive layer 340 may be formed on the composite dielectric layer 330. The second conductive layer 340 may correspond to an upper electrode. The second conductive layer 340 may or may not include a poly-silicon doped with impurities. Alternatively, the second conductive layer 340 may include a metal and/or a metal nitride. The metal may be titanium, ruthenium, tantalum and/or tungsten. The metal nitride may be titanium nitride, ruthenium nitride, tantalum nitride and/or tungsten nitride.

According to the example embodiments of the present invention, a native oxide layer, formed on a first conductive layer, may be removed so that a nitriding process may be more efficiently performed on the first conductive layer. In addition, current leakage and/or an impurity penetration through the first conductive layer may be retarded by nitriding the surface of the first conductive layer.

Furthermore, a composite dielectric layer may have a double-layered structure that may include a first dielectric layer and/or a second dielectric layer. Thus, crystallization of the composite dielectric layer may be suppressed. In addition, crystallization of the composite layer may be more efficiently suppressed when the composite dielectric layer includes a laminated structure in which the first dielectric layer and/or the second dielectric layer may be alternatively stacked. As a result, the electrical characteristics of the semiconductor device may be largely improved for a semiconductor (e.g., a non-volatile memory device, a capacitor, etc.) employing the composite dielectric layer.

The foregoing example embodiments are illustrative of the present invention and are not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A semiconductor device, comprising:
   a substrate;
   a tunnel dielectric layer having a thickness of about 50 Å to about 100 Å formed on the substrate;
   a first conductive layer formed on the tunnel dielectric layer;
   an oxide layer formed on the first conductive layer;
   a nitride layer formed on the first conductive layer, after removing the oxide layer;
   a composite dielectric layer, the composite dielectric layer including a first dielectric layer and a second dielectric layer, the second dielectric layer including a material having a higher crystalline temperature than the first dielectric layer; and
   a second conductive layer formed on the composite dielectric layer.

2. The semiconductor device of claim 1, wherein
   the nitride layer has a thickness of about 5 Å to about 20 Å; and
   the composite dielectric layer has thickness of about 100 Å to about 500 Å.

3. The semiconductor of claim 1, wherein the tunnel dielectric layer includes silicon dioxide or silicon oxynitride.

4. The semiconductor device of claim 1, further comprising a preliminary conductive layer, which is a poly-silicon doped with n-type impurities and has a thickness of about 1,000 Å to about 1,500 Å, formed between the tunnel dielectric layer and the first conductive layer.

5. The semiconductor device of claim 1, wherein the first conductive layer includes a metal or metal nitride, the metal or metal nitride being selected from the group consisting of titanium, ruthenium, tantalum, tungsten, titanium nitride, ruthenium nitride, tantalum nitride and tungsten nitride.

6. The semiconductor device of claim 1, wherein the composite dielectric layer includes the first dielectric layer having a higher dielectric constant than the second dielectric layer.

7. The semiconductor device of claim 6, wherein the first dielectric layer includes zirconium oxide and the second dielectric layer includes hafnium oxide or aluminum oxide.

8. The semiconductor device of claim 1, wherein
   the first dielectric layer is formed from a first reaction material or a first oxidizer; and
   the second dielectric layer is formed from a second reaction material or a second oxidizer,
   each of the first and second reaction materials including a first portion and a second portion, wherein the first portion or the second portion of the first reaction material is bonded to the nitride layer, and the first portion or the second portion of the second reaction material is bonded to the first dielectric layer.

9. The semiconductor device of claim 1, wherein the second conductive layer includes a poly-silicon layer doped with impurities and having a thickness of about 1,000 Å, and a metal silicate layer, having a thickness of about 100 Å to about 1,500 Å, formed on the poly-silicon layer.

10. The semiconductor device of claim 1, wherein the substrate includes source-drain electrodes, wherein the first conductive layer corresponds to a lower source-drain electrode and the second conductive layer corresponds to an upper source-drain electrode.

11. The semiconductor device of claim 1, wherein the second conductive layer, the composite dielectric layer, the nitride layer, the first conductive layer and the tunnel dielectric layer are patterned form a patterned gate structure including a control gate electrode, a composite dielectric layer pattern, a nitride layer pattern, a floating gate electrode and a tunnel dielectric layer pattern.

* * * * *